(12) United States Patent
Zuo et al.

(10) Patent No.: US 8,002,021 B1
(45) Date of Patent: Aug. 23, 2011

(54) HEAT EXCHANGER WITH INTERNAL HEAT PIPE

(75) Inventors: Zhijun Zuo, Lancaster, PA (US); Scott Garner, Lititz, PA (US)

(73) Assignee: Advanced Cooling Technologies, Inc., Lancaster, PA (US)

( * ) Notice: Subject to any disclaimer, the term of this patent is extended or adjusted under 35 U.S.C. 154(b) by 871 days.

(21) Appl. No.: 12/012,577

(22) Filed: Feb. 4, 2008

(51) Int. Cl.
*F28F 7/02* (2006.01)

(52) U.S. Cl. .............. 165/80.4; 165/104.14; 165/104.21

(58) Field of Classification Search ............ 165/80.4, 165/80.5, 104.13, 104.14, 104.21, 104.33
See application file for complete search history.

(56) References Cited

U.S. PATENT DOCUMENTS

| | | | |
|---|---|---|---|
| 5,586,549 A | | 12/1996 | Hartenstine et al. |
| 5,844,777 A | * | 12/1998 | Gates ........................... 361/700 |
| 6,142,222 A | * | 11/2000 | Kang et al. ..................... 165/148 |
| 7,092,255 B2 | * | 8/2006 | Barson et al. ................. 361/699 |
| 2007/0151712 A1 | * | 7/2007 | Foster et al. ............. 165/104.33 |
| 2007/0272391 A1 | * | 11/2007 | Xia et al. ..................... 165/80.3 |

* cited by examiner

*Primary Examiner* — Teresa Walberg
(74) *Attorney, Agent, or Firm* — Martin Fruitman

(57) ABSTRACT

The invention is a heat exchanger transferring heat from a small heat source to a moving fluid. The inherent limitation of such a system is that most of the heat transfer to the fluid occurs only in the immediate vicinity of the heat input even though a large surface area heat transfer structure such as fins or small fluid passages is used to enhance the heat transfer within the heat exchanger. The invention adds a heat pipe inside the heat exchanger enclosure and in contact with the heat transfer structure. The heat pipe spreads the incoming heat over a larger part of the surface area of the heat transfer structure and improves the heat transfer to the cooling fluid by furnishing multiple heat transfer locations without adding extra thermal resistance between the heat source and the fluid flow.

5 Claims, 2 Drawing Sheets

HEAT EXCHANGER WITH INTERNAL HEAT PIPE

BACKGROUND OF THE INVENTION

This invention deals generally with heat exchangers and more specifically with a device for using cooling fluid such a liquid to remove heat from a small device producing a significant amount of heat.

High power density electronic, optical, and electrical devices are sometimes cooled by attaching them to an exterior surface of a wall of a liquid cooled "cold plate" or heat exchanger, a relatively low height enclosure that has liquid flowing through the volume of the enclosure. The heat flow path in such a system is from the heat source, into and through the wall of the liquid enclosure, and then into the liquid that is flowing through the heat exchanger enclosure.

In order to increase the surface available to transfer heat into the liquid, a heat transfer structure is typically attached to the interior surface of the wall of the heat exchanger enclosure to which the heat source is attached. The main goals of such a heat transfer structure are to increase the area of the heat transfer surfaces between the heat source and the liquid, and to facilitate convective heat transfer between the heat transfer structure and the liquid. Some of the configurations used for heat transfer structures are small channels formed into the inner walls of the heat exchanger enclosure, folded miniature fins, porous structures through which the liquid flows, pin fins protruding from the inner walls of the enclosure, and various flow channel layouts or flow turbulence creating structures.

Regardless of the specific structure, the goals are to minimize the temperature drop between the heat exchanger enclosure inner wall and the thermal transfer structure by having a good thermally conductive bond between them, and to minimize the liquid flow pressure drop while maximizing the heat transfer surfaces between the heat transfer structure and the liquid coolant.

However, because of limited heat conductivity within heat transfer structures the prior art heat transfer structures within enclosures are only effective within a limited region quite close to the heat source. They are not effective in spreading the heat longitudinally along the liquid flow path or laterally in the direction perpendicular to the flow. The regions upstream and downstream of the heat source are much less effective in removing heat because of the longer heat conduction paths to those regions within heat transfer structure. The requirement of heat transfer structures for large surface areas within limited spaces leads to thin structures that limit heat conduction over the longer distances within heat exchanger enclosures.

Most efforts to address this problem have added heat pipes either between the heat source and the envelope or within the wall of the envelope itself. While such approaches are effective in spreading the heat from the heat source over the length and width of the envelope, they have a substantial shortcoming in that the heat pipe is required to transfer the entire heat load. That means the heat pipe is in the main heat transfer path. This places a burden on the heat pipe, and for applications in which the heat pipe and liquid heat transfer coefficients are of the same order of magnitude such structures are less effective because the extra thermal resistance of the heat pipe affects all the heat being moved.

It would be very beneficial to have a cold plate heat exchanger that compensated for the low thermal conductivity of the typical heat transfer structure without the possibility of adding thermal resistance between the heat source and the coolant flow.

SUMMARY OF THE INVENTION

The present invention places a heat pipe, a high heat transfer device, into the heat transfer structure itself rather than in the path between the heat exchanger enclosure wall and the heat transfer structure. The heat pipe spreads the incoming heat over a larger part of the surface area of the heat transfer structure and improves the heat transfer to the cooling fluid by furnishing multiple heat transfer locations. Such a structure adds the heat pipe as a heat transfer path in parallel to the heat transfer structure rather than adding thermal resistance between the heat source and the heat transfer structure.

For example, considering a typical heat transfer structure such as fins, the heat pipe is oriented longitudinally within the fin assembly, parallel to the length of the heat exchanger enclosure and parallel to the planes of the fins. The heat pipe is attached to the fins in any conventional manner that acts as a low thermal resistance junction, and the heat pipe typically extends for the entire length of the heat transfer structure.

Thus, the heat transfer between the heat source and the heat transfer structure, the fins of the present example, is not affected at all. However, the heat transfer throughout the fins, which is usually quite poor, is dramatically improved. In the present invention, the heat which only enters the heat transfer structure very near the location of the heat source and normally has significant thermal resistance to move to the rest of the heat transfer structure is transferred to the upstream and downstream portions of the heat transfer structure very efficiently. This puts the entire heat transfer structure at virtually the same temperature as its area near the inner wall of the heat exchanger that is adjacent to the heat source and thus greatly increases the heat transfer into the liquid.

An interesting aspect of the present invention is that the heat pipes are not limited to the classic cylindrical pipe. For instance, for a planar heat exchanger, a so-called "cold plate", the heat pipe itself can be a planar structure, or can be several miniature cylindrical heat pipes laid out in a planar configuration. Furthermore, several miniature cylindrical heat pipes can be embedded within a metal plate, thus mimicking a planar heat pipe. Regardless of the specific configuration, with one or more heat pipes transferring heat throughout the entire heat transfer structure, the present invention provides a significantly more effective device for cooling small heat sources.

DETAILED DESCRIPTION OF THE INVENTION

Figure 1:
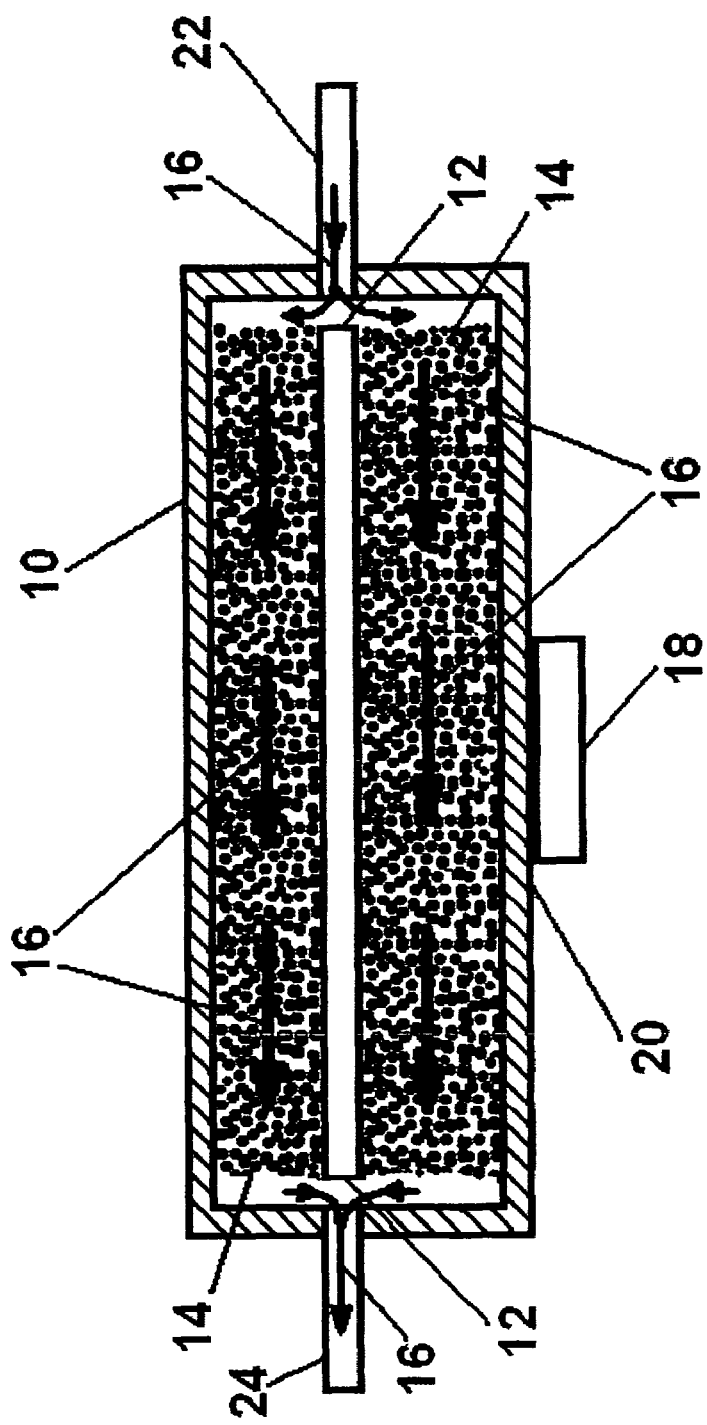
FIG. 1 is a cross section view of the preferred embodiment of the invention showing a planar cold plate with a planar heat pipe located within a porous material heat transfer structure.

FIG. 1 is a cross section view of the preferred embodiment of the invention shown with the end plate of planar cold plate heat exchanger 10 removed, thus showing planar heat pipe 12 located within thermally conductive porous material 14. Porous material 14 functions as the heat transfer structure to move heat into liquid 16 which is flowing through cold plate heat exchanger 10. Porous material 14 is installed in thermal transfer contact with heat pipe 12 and with the inner walls of cold plate heat exchanger 10, and heat source 18 is attached to the outer walls of cold plate heat exchanger 10 in a manner to provide efficient heat transfer between them.

Without the presence of heat pipe 12, FIG. 1 would essentially be depicting the prior art devices and have their same deficiencies. Since only that part of wall 20 of cold plate heat exchanger 10 that is adjacent to heat source 18 is actually heated significantly, only that part of porous material 14 which is also close to heat source 18 is actually transferring much heat to the flowing liquid. The upstream liquid flow between heat source 18 and liquid inlet 22 and the downstream liquid flow between heat source 18 and liquid outlet 24 would pick up very little heat because those regions of the porous material do not themselves receive much heat. This is because of the longer heat conduction paths to those regions within heat transfer structure. Furthermore, the large surface area requirement for heat transfer structure 14 and its location within a limited space leads to its composition of small granular components with spaces between them, and that increases thermal flow resistance over those longer distances within cold plate heat exchanger 10.

Heat pipe 12 changes that. Heat pipe 12 extends over essentially the entire length of porous material heat transfer structure 14, and it functions, as all heat pipes do, to equalize the temperature over its entire length. Thus, as heat source 18 heats porous material 14 in the central region of cold plate heat exchanger 10, and heat pipe 12 is heated by porous material 14 in that central region, heat pipe 12 transfers heat to the entire volume of porous material 14 which is in contact with heat pipe 12. Since FIG. 1 shows the cross section of cold plate heat exchanger 10 with a planar structure, and heat pipe 12 is also a planar structure, heat pipe 12 actually equalizes the temperature of porous material heat transfer structure 14 throughout its entire volume, and thereby significantly increases the heat transfer surface that is transferring heat to liquid 16. In many applications this can dramatically reduce the size of the cold plate heat exchanger that is needed for each attached heat source.

It should be pointed out that the heat pipes in prior art are typically embedded in the enclosure wall or located in between the enclosure inner wall and the heat transfer structure. In such arrangements all the heat load must go through the heat pipe before entering the heat transfer structure and eventually the coolant flow. The heat pipe presents an extra thermal resistance in the heat flow path. This extra thermal resistance becomes particularly detrimental in cases where the heat transfer coefficient between the heat transfer structure and the coolant flow is high. In those cases, the extra heat pipe thermal resistance becomes dominant, and the benefits of the heat spreading by the heat pipe may be outweighed by the degradation caused by its dominant thermal resistance. In the present invention as illustrated in FIG. 1, heat pipe 12 does not impede the heat flow path from heat source 18 to the wall of enclosure 10, to heat transfer structure 14, and then to coolant flow 16. The majority of the heat goes directly into coolant flow 16 without going through heat pipe 12. A portion of the heat is conducted through heat transfer structure 14 and into heat pipe 12. This portion of heat is spread by heat pipe 12 to large regions of heat transfer structure 14 for dissipation into coolant flow 16. In the present invention, heat pipe 12 is always supplementing and never impeding the heat transfer.

It should also be appreciated that FIG. 1 can also represent the cross section of a cylindrical heat exchanger with a cylindrical internal heat pipe or a planar heat exchanger with several cylindrical internal heat pipes arranged in a planar configuration.

Figure 2:
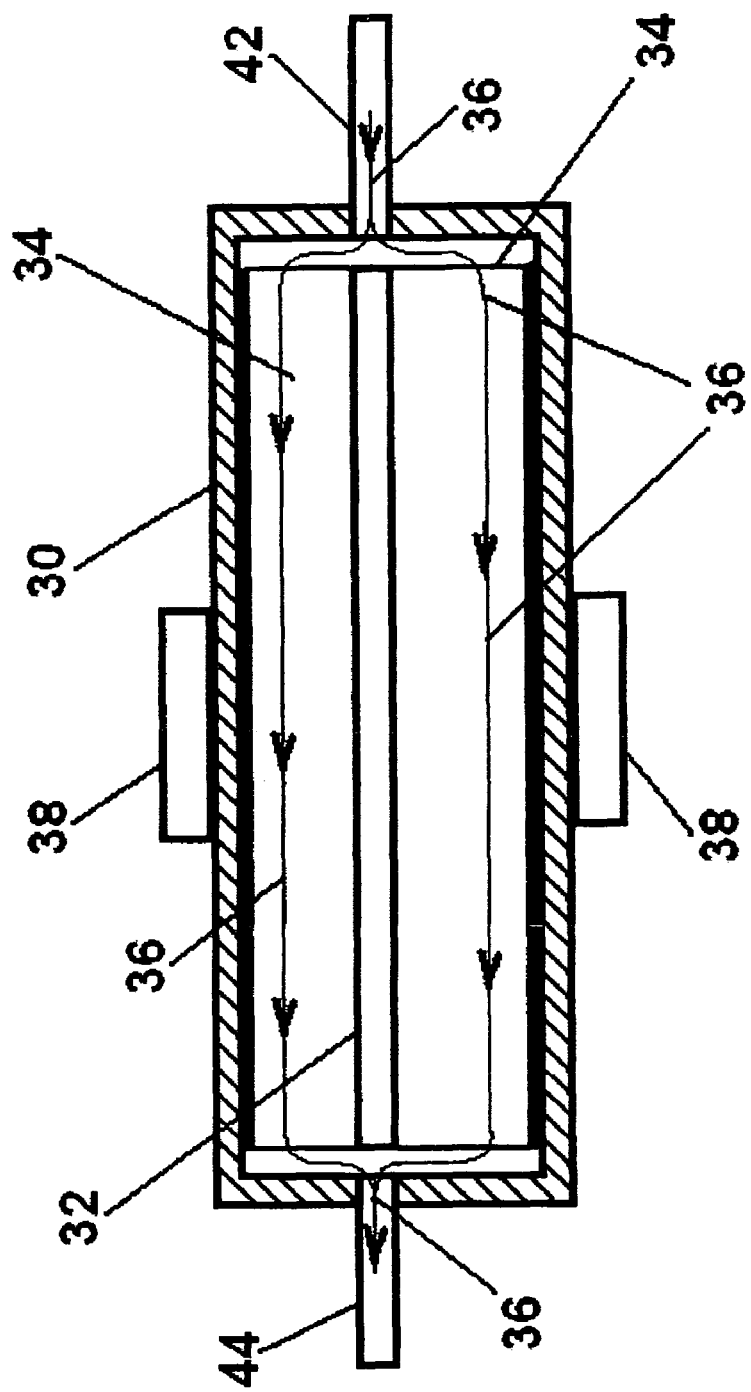
FIG. 2 is a cross section view of an alternate embodiment of the invention showing a planar cold plate with a planar heat pipe located within a fin heat transfer structure.

FIG. 2 is a cross section view of an alternate embodiment of the invention shown with the end plate of planar cold plate heat exchanger 30 removed, thus showing planar heat pipe 32 located within fin heat transfer structure 34. Fin heat transfer structure 34 functions as the heat transfer structure to move heat into liquid 36 which is flowing through cold plate heat exchanger 30. Fin heat transfer structure 34 is installed in thermal transfer contact with heat pipe 32 and with the inner walls of cold plate heat exchanger 30, and heat source 18 is attached to the outer walls of cold plate heat exchanger 30 in a manner to provide efficient heat transfer between them.

Cold plate heat exchanger 30 actually differs from cold plate heat exchanger 10 of FIG. 1 only in that its heat transfer structure is a fin structure as opposed to the porous material heat transfer structure of FIG. 1. It should be appreciated that the view of FIG. 2 shows only the end sheets of a configuration of fins 34 which, when viewed from either liquid input pipe 42 or liquid output pipe 44, appears as the openings of a group of attached tunnels. Thus, liquid 36 actually flows through the spaces between sheets that extend most of the distance between the input and output pipes, leaving only the spaces near the liquid input and output to distribute the liquid into and collect it from the tunnels. Also, as with the porous material heat transfer structure 14 in cold plate heat exchanger 10 of FIG. 1, fin heat transfer structure 34 is in thermal transfer contact with both heat pipe 32 and the inner walls of cold plate heat exchanger 30. FIG. 2 also shows the installation of two heat sources, one on each of the two surfaces of cold plate heat exchanger 30, and it should be appreciated that many more heat sources can be attached to each of these surfaces depending upon the particular configuration of the planar heat exchanger.

It should also be appreciated that the particular configuration of the heat transfer structure can be varied in many ways. Such structures as small channels machined into the inner walls of the heat exchanger, pin fins protruding from the inner walls of the enclosure, and various flow channel layouts or flow turbulence creating structures can also be used. Regardless of the specific configuration, with one or more heat pipes transferring heat throughout the entire heat transfer structure, the present invention provides a significantly more effective heat exchanger for cooling small heat sources.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims. For example, air or other fluids can be used instead of the liquid described in regard to the embodiments described, and the heat exchanger can include additional fluid inlets and outlets.

What is claimed as new and for which Letters patent of the United States are desired to be secured is:

1. A heat exchanger comprising:
   a sealed enclosure with thermally conductive walls and at least one fluid inlet and at least one fluid outlet
   a heat source in thermally conductive contact with at least one surface of a wall of the enclosure;
   a thermally conductive heat transfer structure located within the enclosure and mounted in thermally conductive direct contact with an inner surface of at least one wall of the enclosure with which a heat source has contact, with the heat transfer structure located and constructed so that fluid moving between the inlet and the outlet removes heat from the heat transfer structure; and
   at least one heat pipe located within the enclosure and installed so that it is in thermally conductive contact with the heat transfer structure in at least two contact areas, with one of the contact areas located in an area of the heat transfer structure that receives heat from a heat source, and with another contact area located remote from the area of the heat transfer structure that receives heat from a heat source, so that the heat pipe moves heat from the contact area receiving greater heat from the heat source into a contact area receiving less heat from the heat source.

2. The heat exchanger of claim 1 wherein the heat transfer structure is constructed of porous material and is a volume in contact with the enclosure inner walls.

3. The heat exchanger of claim 1 wherein the heat transfer structure is a fin structure of at least two parallel fins each with an attached heat pipe between the fluid input and the fluid output.

4. The heat exchanger of claim 1 wherein the heat transfer structure is flow channels formed in the enclosure wall.

5. The heat exchanger of claim 1 wherein the enclosure is a planar structure.

* * * * *